United States Patent
Selcuk et al.

[11] Patent Number: 5,889,697
[45] Date of Patent: Mar. 30, 1999

[54] MEMORY CELL FOR STORING AT LEAST THREE LOGIC STATES

[75] Inventors: Asim A. Selcuk, Cupertino; Craig S. Sander, Mountain View, both of Calif.

[73] Assignee: Advanced Micro Devices, Sunnyvale, Calif.

[21] Appl. No.: 947,123

[22] Filed: Oct. 8, 1997

[51] Int. Cl.$^6$ .................................................. G11C 11/00
[52] U.S. Cl. .................... 365/154; 365/188; 365/148; 365/156; 365/174
[58] Field of Search ................... 365/185.03, 189.01, 365/154, 188, 148, 156, 174

[56] References Cited

U.S. PATENT DOCUMENTS

| | | | |
|---|---|---|---|
| 5,172,338 | 12/1992 | Mehrotra et al. | 365/189.01 |
| 5,218,569 | 6/1993 | Banks | 365/189.01 |
| 5,293,560 | 3/1994 | Harari | 365/189.07 |
| 5,311,076 | 5/1994 | Park et al. | 307/443 |
| 5,390,143 | 2/1995 | Manning | 365/145 |
| 5,635,731 | 6/1997 | Ashida | 257/67 |
| 5,757,051 | 5/1998 | Wu et al. | 257/368 |
| 5,761,110 | 6/1998 | Irrinki et al. | 365/100 |

*Primary Examiner*—Viet Q. Nguyen
*Attorney, Agent, or Firm*—Foley & Lardner

[57] ABSTRACT

A memory cell for storing data having at least three logic states includes a pair of storage devices and third-level storage and refresh circuitry coupled to a pair of storage nodes. The storage devices maintain multi-level signals representative of first and second logic states at the pair of storage nodes. To store a third logic state, the third-level storage and refresh circuitry maintain the multi-level signals at both storage nodes at substantially equal intermediate levels.

20 Claims, 4 Drawing Sheets

MEMORY CELL FOR STORING AT LEAST THREE LOGIC STATES

FIELD OF THE INVENTION

The present invention relates generally to semiconductor memory devices. More particularly, the invention relates to a memory cell for storing at least three logic states.

BACKGROUND OF THE INVENTION

More sophisticated technology has created a heightened demand for smaller, faster semiconductor devices incorporating an ever increasing number of components. An area of special interest is semiconductor memory devices, such as a random access memory ("RAM"), having greater storage capacity.

Typically, to increase the storage capacity of memory devices, a greater number of individual memory cells, as well as the additional components required to access the added cells, are incorporated. Because available area within a memory device is at a premium, the physical layout of the components must become more compact and the physical dimensions of each component must be decreased to prevent the overall dimensions of the memory devices from becoming excessively large. However, the ability to continue to decrease physical parameters is limited.

The need to increase storage capacity within the bounds of such physical constraints is especially critical in static RAM ("SRAM") devices in which a typical memory cell includes two cross-coupled storage devices coupled to a pair of complementary storage nodes which are accessed by two pass transistors coupled to complementary bit lines. The pass transistors have gate electrodes coupled to a word line. A signal, such as an address or SELECT signal, is provided on the word line associated with the memory cell to select or access the memory cell. Once selected via the word line, the memory cell can be read or written to through the pass transistors via the bit lines.

Such memory cells generally store only two logic states, thus severely limiting the storage capacity of the memory device. The first logic state is typically represented by a HIGH level signal stored at a first storage node and a LOW level signal stored at the second, complementary storage node. Similarly, the second logic state is represented by a LOW level signal stored at the first storage node and a HIGH level signal stored at the second, complementary storage node.

A memory cell capable of storing more than two logic states can increase the storage capacity of a memory device without requiring a corresponding increase in the number of individual memory cells and which may decrease the amount of layout area needed on the semiconductor substrate. Accordingly, rather than looking solely to component dimensions and component layout to increase storage capacity, a need exists for a memory cell capable of storing more than two logic states.

SUMMARY OF THE INVENTION

The invention provides an innovative semiconductor memory cell for storing at least three logic states. The memory cell provides for increased storage capacity in a memory device, such as an SRAM, without requiring a corresponding increase in the number of memory cells.

Accordingly, in a first aspect of the invention, a semiconductor memory cell for storing at least three logic states includes a pair of bit lines, a pair of storage nodes, a pair of storage devices, and a third-level storage circuit. The bit lines carry multi-level signals representative of data having at least three logic states. The multi-level signals are applied to the storage nodes where they are maintained by either the storage devices or the third-level storage circuit. That is, the storage devices maintain the multi-level signals at the storage nodes when the signals are representative of either a first logic state or a second logic state. In the third logic state, the third-level storage circuit maintains the multi-level signals at each storage node at substantially equal voltage levels.

In accordance with another aspect of the invention, an SRAM cell for storing data having at least three logic states comprises a pair of bit lines, a pair of storage nodes, a pair of cross-coupled inverters, and a third-level storage circuit. The bit lines carry multi-level signals representative of data having at least three logic states. The multi-level signals have a HIGH level, a LOW level, and an intermediate level having a magnitude between the magnitudes of the HIGH and LOW levels. The storage nodes, which are electrically coupled to the bit lines, hold the multi-level signals. The cross-coupled inverters are coupled to the storage nodes and are configured to maintain the SRAM cell in the first and second logic states. That is, the inverters maintain the HIGH level at one of the storage nodes and the LOW level at the other storage node such that the SRAM cell stores the first logic state, and vice versa when the SRAM cell stores the second logic state. To store the third logic state, the third-level storage circuit, which also is electrically coupled to the storage nodes, maintains the intermediate level at both storage nodes.

A further aspect of the invention provides a method for storing data having at least three logic states in a memory cell. Multi-level signals representative of the data having at least three logic states are applied to a pair of storage nodes. The multi-level signals have magnitudes ranging from a HIGH level to a LOW level. To store a first logic state, a first storage device is activated such that the LOW level is held at one of the storage nodes. Similarly, to store a second logic state, a second storage device is activated to hold the LOW level at the other one of the storage nodes. A third logic state is stored by activating third-level storage circuit to hold substantially equal intermediate level signals at both storage nodes.

BRIEF DESCRIPTION OF THE DRAWINGS

The present invention will become more fully understood from the following detailed description, taken in conjunction with the accompanying drawings, wherein like reference numerals denote like elements and in which.

DETAILED DESCRIPTION OF THE PREFERRED EMBODIMENTS

Figure 1:
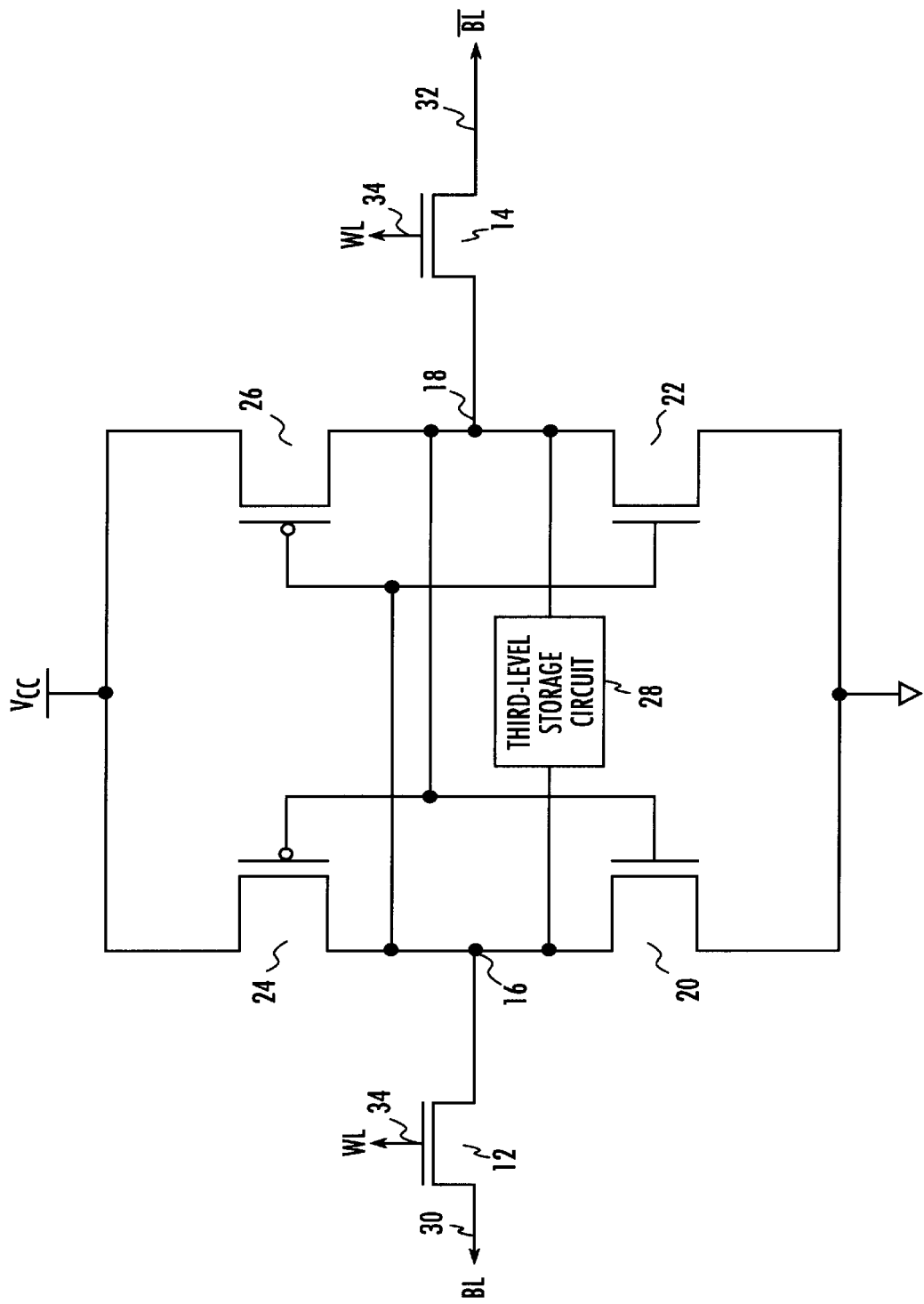
FIG. 1 is an electrical schematic diagram illustrating an exemplary SRAM memory cell and third-level storage circuit in accordance with the invention.

Turning now to FIG. 1, a preferred embodiment of a memory cell 10 of an SRAM device in accordance with the invention is illustrated. Memory cell 10 is capable of storing data having at least three logic states and includes a pair of pass transistors 12, 14 to access a pair of storage nodes 16, 18; a pair of drive (or pull-down) transistors 20, 22; a pair of load (or pull-up) transistors 24, 26; and a third-level storage circuit 28. A pair of bit lines 30, 32 carry multi-level signals to and from cell 10 in response to a READ or WRITE signal applied to a word line 34.

Load transistor 24 and drive transistor 20 form a storage device configured as an inverter 36 (see FIG. 2) having an input at the junction of their gates. Likewise, transistors 26 and 22 form a storage device configured as an inverter 38 (see FIG. 2) having an input at the junction of their gates. The input of inverter 36 is coupled to the output of inverter 38 at storage node 16. Similarly, the input of inverter 38 is coupled to the output of inverter 36 at storage node 18. For the sake of simplicity, transistors 20, 22, 24, and 26 will be illustrated in the subsequent FIGURES as cross-coupled inverters 36 and 38 having interconnected inputs and outputs at storage nodes 16 and 18.

Load transistors 24, 26 preferably are p-channel transistors, which maintain the voltage at storage nodes 16, 18 at a HIGH level (e.g., VCC) when drive transistors 20, 22 are not activated, respectively. Drive transistors 20, 22 preferably are n-channel enhancement-mode transistors, although other types of transistors or other switching devices may be utilized for maintaining the voltage at storage nodes 16, 18 at a LOW level (e.g., ground) when drive transistors 20, 22 are not activated. The threshold voltages of transistors 20, 22, 24, and 26 are specially selected, as will be discussed below, such that memory cell 10 can store at least three logic states.

Storage node 16 is coupled to pass transistor 12 which is controlled by word line 34. Storage node 18 is coupled to pass transistor 14 which also is controlled by word line 34. Pass transistors 12, 14 preferably are n-channel enhancement-mode transistors, although other types of transistors may be used, provided corresponding modifications to the voltage levels of the read and write signals also are made.

In the preferred embodiment illustrated, memory cell 10 stores multi-level signals on nodes 16, 18 representative of a logic or data bit having at least three logic states. The first and second logic states are represented by complementary (e.g., HIGH and LOW) multi-level signals stored on nodes 16, 18. The third logic state is represented by substantially equal multi-level signals stored on nodes 16, 18. The magnitude of the multi-level signal in the third logic state is in the range between the magnitudes of the complementary multi-level signals of the first and second logic states, and preferably is intermediate the magnitudes of the complementary multi-level signals (e.g., VCC/2).

For the first and second logic states of the data stored in cell 10, transistors 20, 22, 24 and 26 cooperate to store the complementary multi-level signals at storage nodes 16, 18. That is, in the first logic state, drive transistor 22 and load transistor 24 are activated by the multi-level signals applied to storage nodes 16, 18 via bit lines 30, 32, while transistors 20 and 26 are turned off. The cross-coupling of the transistors creates a latch, thus maintaining a HIGH level (e.g., VCC) at node 16 and a LOW level (e.g., ground) at node 18. Conversely, in the second logic state, drive transistor 20 and load transistor 26 are activated and transistors 22 and 24 are turned off. Thus, the second logic state is represented by a HIGH level maintained at node 18 and a LOW level at node 16.

Typically, the magnitude of the HIGH level, or VCC, has a value of either 3.3 V or 5 V, although other values are also possible, provided the threshold voltages of transistors 20, 22, 24, and 26 are scaled accordingly. The magnitude of the LOW level typically is ground, although other values are possible, provided the magnitude is less than the magnitude of the HIGH level and the transistor threshold voltages are appropriately scaled. Selection of the threshold voltages for transistors 20, 22, 24, and 26 is discussed more fully below.

When substantially equal intermediate level signals (e.g., VCC/2) are applied to storage nodes 16, 18, transistors 20–26 all are turned off. Instead, third-level storage circuit 28 operates to maintain the multi-level signals at both storage nodes 16 and 18 at the substantially equal intermediate level, thereby storing the third logic state.

To enable storage of the third logic state, the threshold voltages of transistors 20–26 are selected such that transistors 20–26 are not activated upon application of the intermediate level signals to nodes 16, 18 via bit lines 30, 32. However, the threshold voltages also satisfy the requirement that transistors 20–26 turn on and off appropriately upon application to storage nodes 16, 18 of the multi-level signals representative of the first and second logic states. Accordingly, the magnitude of the threshold voltages of drive transistors 20, 22 is selected to be greater than the magnitude of the intermediate level; and the threshold voltage magnitude of load transistors 24, 26 is selected to be greater than the difference between the intermediate level and VCC.

As described herein and in the preferred embodiment, the magnitude of the intermediate level of the multi-level signal is approximately midway between the magnitudes of the HIGH and LOW levels (e.g., VCC/2). Thus, the threshold voltages of transistors 20–26 may fall within the range between VCC and VCC/2. However, it should be understood that the multi-level signals of the third logic state may have any magnitude that falls between the magnitudes of the HIGH and LOW levels, provided that the third logic state signals are substantially equal and that the threshold voltages of the cross-coupled storage devices are adjusted accordingly. The threshold voltages of the storage devices (e.g., transistors 20–26) may be adjusted by appropriate, conventional doping techniques during the fabrication process.

Figure 2:
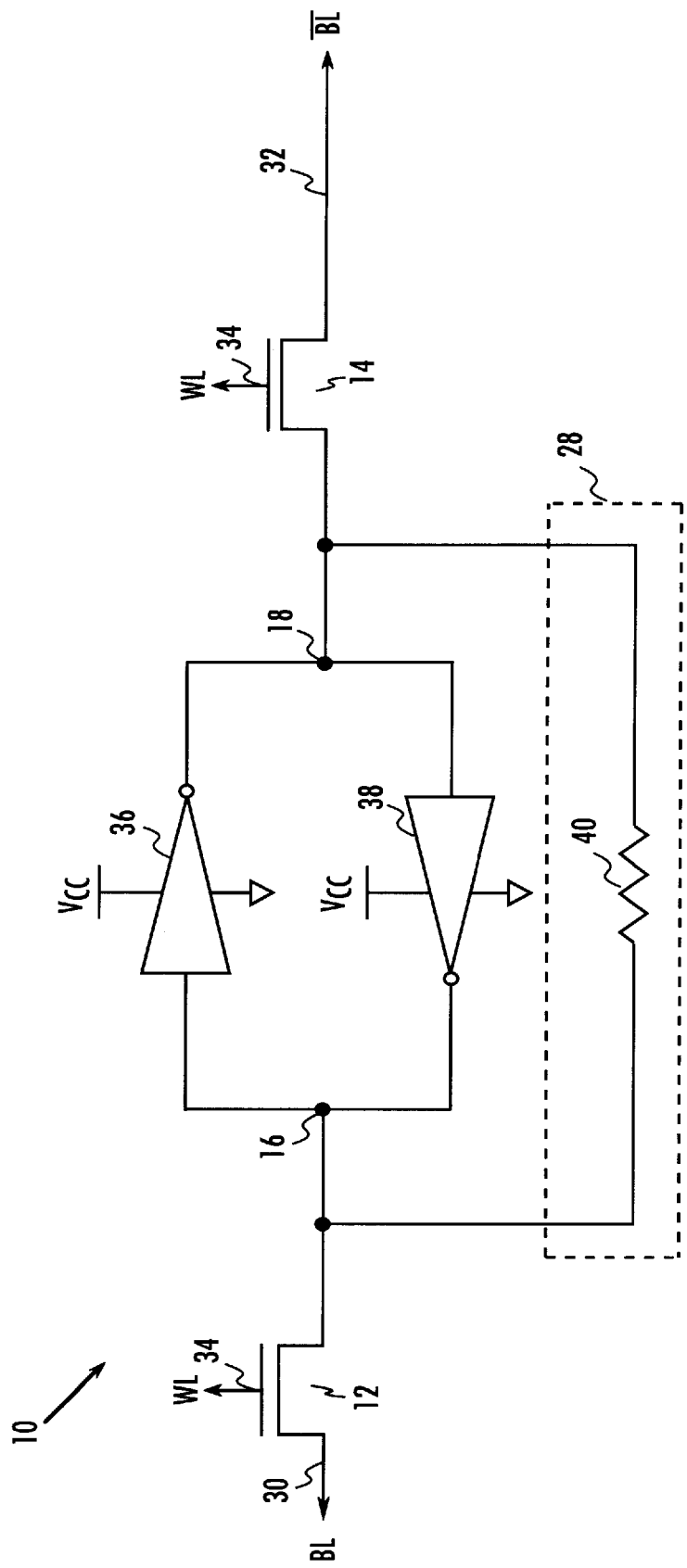
FIG. 2 is an electrical schematic diagram of an exemplary embodiment of the device of FIG. 1 in which the third-level storage circuit is represented as a resistor.

Referring now to FIG. 2, an exemplary embodiment of memory cell 10 of FIG. 1 is illustrated. In FIG. 2, third-level storage circuit 28 is implemented as a resistor 40 coupled between storage nodes 16 and 18. As discussed above, approximately equal intermediate level signals are applied to storage nodes 16, 18 in the third logic state. Because the magnitude of the intermediate level is less than the threshold voltage required to activate inverters 36, 38, the inverters are not triggered and thus do not operate to maintain the signals at nodes 16, 18. Instead, resistor 40 maintains the signals at nodes 16, 18 at substantially equal levels, thus ensuring that cell 10 maintains the data in the third logic state.

Figure 3:
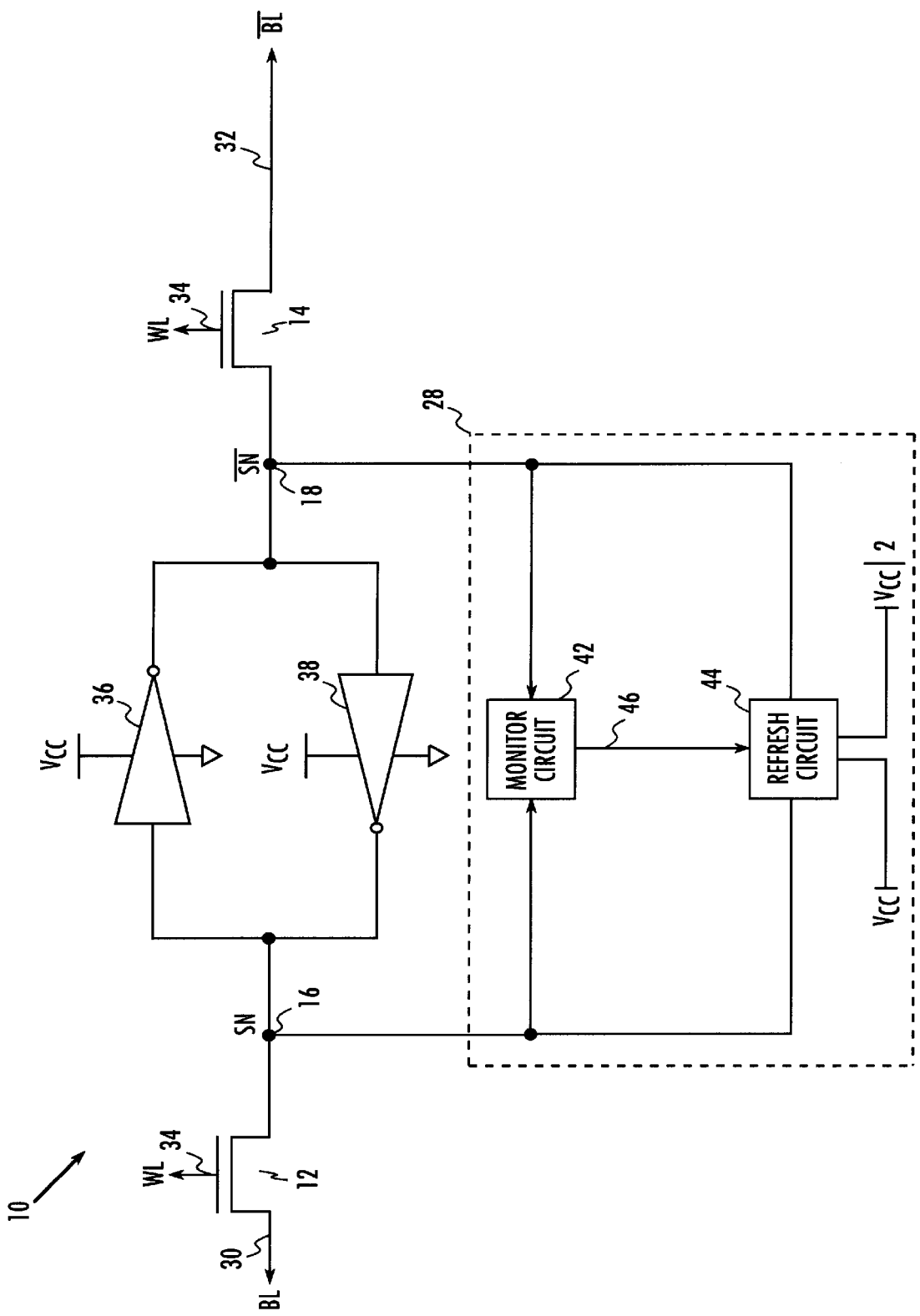
FIG. 3 is an electrical schematic diagram of another exemplary embodiment of the third-level storage circuit of FIG. 1 in accordance with the invention in which the third-level storage circuit further includes a monitor circuit and a refresh circuit.

Referring now to FIG. 3, an alternative preferred embodiment of cell 10 of FIG. 1 is illustrated in which third-level storage circuit 28 is implemented as a monitor circuit 42 and a refresh circuit 44. Monitor circuit 42 monitors the multi-level signals applied to storage nodes 16, 18. When the multi-level signals are representative of the third logic state (e.g., have approximately equal intermediate magnitudes), monitor circuit 42 provides an output signal to refresh circuit 44 via output 46. When the magnitude of the multi-level signals of the third logic state fall below a predetermined threshold value (such as due to leakage currents in cell 10), refresh circuit 44 reapplies, or refreshes, the signals at nodes 16, 18 to maintain the integrity of the data stored in cell 10.

Figure 4:
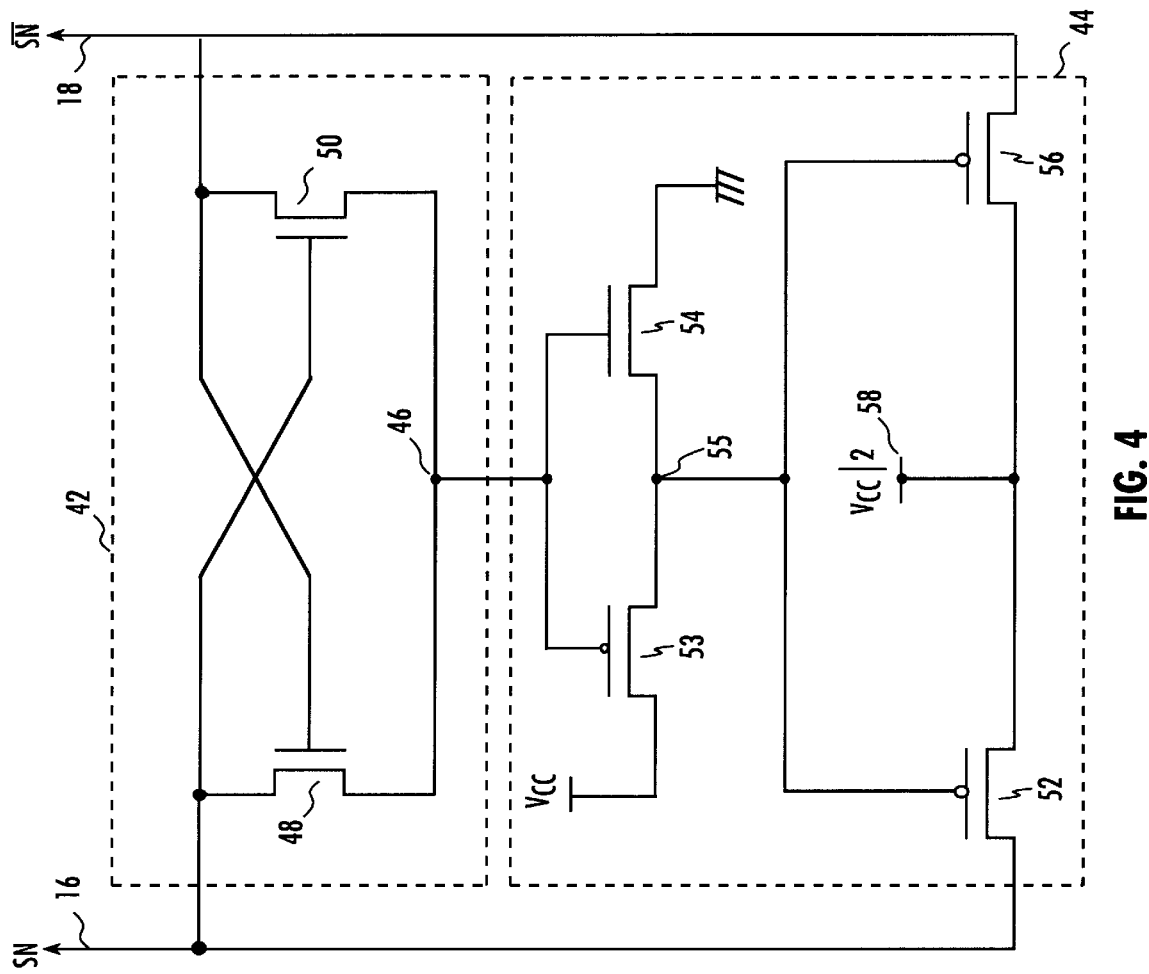
FIG. 4 is an electrical schematic diagram of an exemplary embodiment of the third-level storage circuit of FIG. 3.

FIG. 4 illustrates a preferred embodiment of third-level storage circuit 28 that includes the monitor circuit 42 and refresh circuit 44 of FIG. 3. In FIG. 4, monitor circuit 42 is implemented as a pair of cross-coupled transistors 48 and 50. Transistors 48, 50 preferably are n-channel enhancement mode transistors with low threshold voltages in the range of approximately 0.2 V–0.5 V. However, other types of switching devices may be used or monitor circuit 42 may be implemented in other conventional manners, such as with voltage comparators. In the embodiment illustrated, the drains of transistors 48, 50 are coupled to storage nodes 16, 18, respectively. The gate of transistor 48 is coupled to the drain of transistor 50, and the gate of transistor 50 is coupled to the drain of transistor 48. The sources of transistors 48, 50 are interconnected to form node 46. When the multi-level signals at nodes 16, 18 are at substantially equal intermediate levels (i.e., representative of the third logic state), transistors 48 and 50 are activated, providing a signal at node 46 which is sufficient to activate refresh circuit 44 (e.g., VCC/2—0.5 V)

Refresh circuit 44 comprises an inverter having an input coupled to node 46 and an output formed at node 55. The inverter provides a HIGH level signal (e.g., VCC) at output node 55 when the multi-level signals at nodes 16, 18 are representative of either the first or second logic states. The inverter further provides a LOW level signal (e.g., ground) at node 55 when the multilevel signals at nodes 16, 18 are representative of the third logic state. In the preferred embodiment illustrated in FIG. 4, the inverter is implemented as a low voltage threshold (e.g., 0.2 V–0.5 V) n-channel enhancement mode transistor 54 and a high voltage threshold (e.g., |1.5 V|–|2.0 V|) p-channel transistor 53. Alternatively, transistor 53 may be replaced with a load resistor coupled between VCC and node 55. Or, an additional p-channel transistor may be provided which pulls node 46 up to VCC when the signal stored at nodes 16, 18 is representative of the third logic state.

As illustrated in FIG. 4, the gates of transistors 53, 54 are coupled to node 46 and their drains are coupled to output node 55. The source of transistor 53 is pulled up to VCC and the source of transistor 54 is connected to ground. Accordingly, when the signal at node 46 is LOW (i.e., the first or second logic state), transistor 54 is turned off and transistor 53 is turned on, thereby pulling node 55 up to VCC. When the signal at node 46 is at an intermediate level (i.e., the third logic state), transistor 54 is activated, thereby pulling node 55 down to ground.

Node 55, which is coupled to the output of the inverter, activates restore transistors 52 and 56 when the intermediate voltage level at storage nodes 16, 18 decreases in magnitude due to leakage of the stored charge. Restore transistors 52, 56 preferably are p-channel transistors having their gates coupled to output node 55, and their drains coupled to storage nodes 16, 18, respectively. The sources of transistors 52, 56 are coupled to a voltage supply 58 which is at substantially the same voltage level as the multi-level signal representative of the third logic state (e.g., VCC/2). Accordingly, when the charge stored at storage nodes 16, 18 leaks such that the voltage at either of nodes 16, 18 falls below a threshold level (i.e., the voltage level of supply 58 minus the threshold voltage of transistors 52, 56), transistors 52, 56 will restore nodes 16, 18 to approximately the voltage level of supply 58 (e.g., VCC/2).

While the embodiments illustrated in the FIGURES and described above are presently preferred, it should be understood that these embodiments are offered by way of example only. The invention is not intended to be limited to any particular embodiment, but is defined by the appended claims. For example, the third-level storage circuitry, including the refresh circuitry, may be implemented by other well-known, conventional circuitry. Moreover, the threshold voltages of the storage devices may be adjusted and additional circuitry can be provided to enable storage of data having more than three logic states in memory cell 10. These and other alternative configurations and modifications of the invention, that may occur to those skilled in the art, are intended to form a part of the invention to the extent such alternatives fall within the scope of the appended claims.

What is claimed is:

1. A semiconductor memory cell for storing data having at least three logic states, the cell comprising:

a pair of bit lines to carry multi-level signals representative of the data having at least three logic states;

a pair of storage nodes electrically coupled to the pair of bit lines to store the multi-level signals;

a pair of storage devices electrically coupled to the pair of storage nodes to maintain the multi-level signals at voltage levels representative of a first logic state or a second logic state; and a third-level storage circuit electrically coupled to the pair of storage nodes to maintain the multi-level signals at each of the pair of storage nodes at substantially equal voltage levels, wherein the substantially equal voltage levels are representative of a third logic state.

2. The semiconductor memory cell as recited in claim 1, wherein the third-level storage circuit includes a resistor.

3. The semiconductor memory cell as recited in claim 1, further comprising a refresh circuit electrically coupled to the pair of storage nodes to refresh the third logic state when at least one of the substantially equal voltage levels falls below a threshold value.

4. The semiconductor memory cell as recited in claim 1, wherein the pair of storage devices includes a pair of cross-coupled inverters.

5. The semiconductor memory cell as recited in claim 4, wherein each of the pair of cross-coupled inverters includes a drive transistor having a threshold voltage with a magnitude greater than the magnitude of the substantially equal voltage levels.

6. The semiconductor memory cell as recited in claim 4, wherein each of the pair of cross-coupled inverters includes a load transistor electrically coupled between one of the pair of storage nodes and a voltage supply, the voltage supply having a supply magnitude, wherein each load transistor has a threshold voltage having a magnitude greater than the difference between the supply magnitude and the magnitude of the substantially equal voltage levels.

7. The semiconductor memory cell as recited in claim 1, wherein the memory cell is part of a microprocessor fabricated on a semiconductor substrate.

8. An SRAM cell for storing data having at least three logic states, the SRAM cell comprising:

a pair of bit lines for carrying multi-level signals representative of the data having at least three logic states, the multi-level signals having a HIGH level, a LOW level, and an intermediate level, wherein the magnitude of the intermediate level is between the magnitudes of the HIGH and LOW levels;

a pair of storage nodes electrically coupled to the pair of bit lines to store the multi-level signals;

a pair of cross-coupled inverters electrically coupled to the pair of storage nodes, the cross-coupled inverters configured to maintain the HIGH level at one of the storage nodes and the LOW level at the other one of the storage nodes, and vice versa, thereby storing the first and second logic states, respectively; and a third-level storage circuit electrically coupled to the pair of storage nodes to maintain intermediate levels at both of the storage nodes, thereby storing the third logic state.

9. The semiconductor memory cell as recited in claim 8, wherein the third-level storage circuit includes a resistor.

10. The semiconductor memory cell as recited in claim 8, wherein the third-level storage circuit further comprises a refresh circuit electrically coupled to the pair of storage nodes to refresh the third logic state when the magnitude of the intermediate level stored at at least one of the storage nodes falls below a threshold value.

11. The semiconductor memory cell as recited in claim 8, wherein each of the cross-coupled inverters includes a field effect transistor electrically coupled to one of the pair of storage nodes.

12. The semiconductor memory cell as recited in claim 11, wherein the field effect transistors each have a threshold voltage having a magnitude greater than the voltage magnitude of the intermediate level of the multi-level signals.

13. The SRAM cell as recited in claim 11, wherein each field effect transistor is electrically coupled between one of the pair of storage nodes and a voltage supply, the voltage supply having a supply magnitude, wherein each field effect transistor has a threshold voltage having a magnitude greater than the difference between the supply magnitude and the voltage magnitude of the intermediate level of the multi-level signals.

14. A method for storing data having at least three logic states in a memory cell, comprising:

applying multi-level signals representative of the data having at least three logic states to a pair of storage nodes, the multi-level signals having magnitudes ranging from a HIGH level to a LOW level;

activating a first storage device to hold the LOW level at one of the pair of storage nodes, thereby storing a first logic state;

activating a second storage device to hold the LOW level at the other one of the pair of storage nodes, thereby storing a second logic state; and activating a third-level storage circuit when the multi-level signals applied to the pair of storage nodes have a substantially equal magnitude, thereby storing a third logic state.

15. The method as recited in claim 14, wherein the substantially equal magnitudes of the multi-level signals are approximately midway between the magnitudes of the HIGH and LOW levels of the multi-level signals.

16. The method as recited in claim 14, wherein the first and second storage devices comprise a pair of cross-coupled inverters.

17. The method as recited in claim 16, wherein the pair of cross-coupled inverters each include a drive transistor coupled to one of the storage nodes, each drive transistor having a threshold voltage with a magnitude greater than the substantially equal magnitudes of the multi-level signals representative of the data having the third logic state.

18. The method as recited in claim 14, wherein activating the third-level storage circuit further includes refreshing the multi-level signals when at least one of the substantially equal magnitudes falls below a threshold value.

19. The method as recited in claim 16, wherein the pair of cross-coupled inverters each include a load transistor electrically coupled between one of the pair of storage nodes and a voltage supply, the voltage supply having a supply magnitude, wherein each load transistor has a threshold voltage having a magnitude greater than the difference between the supply magnitude and the substantially equal magnitudes of the multi-level signals representative of the data having the third logic state.

20. The method as recited in claim 14, wherein the memory cell is part of a microprocessor fabricated on a semiconductor substrate.

* * * * *